US010215784B1

(12) United States Patent
Chen et al.

(10) Patent No.: US 10,215,784 B1
(45) Date of Patent: Feb. 26, 2019

(54) MEASURING APPARATUS INCLUDING PHASE LOCKED LOOP AND MEASURING METHOD THEREOF

(71) Applicant: INDUSTRIAL TECHNOLOGY RESEARCH INSTITUTE, Hsinchu (TW)

(72) Inventors: Chun-Han Chen, Hsinchu (TW); Chun-Hsiang Yang, Hsinchu (TW); Yung-Jen Cheng, Hsinchu (TW); Ming-Fa Tsai, Hsinchu (TW); Ying-Che Weng, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/832,942

(22) Filed: Dec. 6, 2017

(30) Foreign Application Priority Data

Dec. 5, 2017 (TW) .............................. 106142545 A (51) Int. Cl.
*H02M 5/42* (2006.01)
*H02M 5/45* (2006.01)
(Continued)

(52) U.S. Cl.
CPC ........... *G01R 21/133* (2013.01); *G01R 25/00* (2013.01); *H02P 23/0004* (2013.01);
(Continued)

(58) Field of Classification Search
CPC ... G01R 21/133; G01R 25/00; H02P 23/0004; H02P 23/0077; H02P 23/14; H03L 7/08
(Continued)

(56) References Cited

U.S. PATENT DOCUMENTS 5,521,482 A * 5/1996 Lang .................... G01R 31/343
318/800
5,661,386 A 8/1997 Kueck et al.
(Continued)

FOREIGN PATENT DOCUMENTS

CN 1375701 10/2002
CN 101820281 9/2010
(Continued)

OTHER PUBLICATIONS

Melfi "Quantifying the Energy Efficiency of Motors Fed by Adjustable Frequency Inverters", Petroleum and Chemical Industry Conference, 2009. PCIC 2009. 2009 Record of Conference Papers—Industry Applications Society 56th Annual, 200909 ,1-7.
(Continued)

*Primary Examiner* — Brandon S Cole
(74) *Attorney, Agent, or Firm* — Amin, Turocy & Watson LLP (57) ABSTRACT

A measuring system, during a measurement process thereof, uses a phase-locked loop mechanism of a stator phase voltage and a stator phase current of a three-phase AC motor to effectively remove harmonics and to sense and obtain the amplitude effective values of the phase voltage and the phase current of the three-phase AC motor and the phase difference between the phase voltage and phase current. Therefore, the measuring apparatus is capable of quickly and accurately calculating the input power of the motor without having to measure the parameters of the motor.

15 Claims, 7 Drawing Sheets

(51) Int. Cl.
  *H02P 21/02* (2006.01)
  *G01R 21/133* (2006.01)
  *H03L 7/08* (2006.01)
  *G01R 25/00* (2006.01)
  *H02P 23/00* (2016.01)
  *H02P 23/14* (2006.01)

(52) U.S. Cl.
  CPC .......... *H02P 23/0077* (2013.01); *H02P 23/14* (2013.01); *H03L 7/08* (2013.01)

(58) Field of Classification Search
  USPC .............. 327/2–12, 105–123, 141, 144–163; 331/1 A, 15–17; 375/373–376
  See application file for complete search history.

(56) References Cited

U.S. PATENT DOCUMENTS

| | | | |
|---|---|---|---|
| 5,883,796 A * | 3/1999 | Cheng | H02J 3/1814 307/105 |
| 5,942,949 A * | 8/1999 | Wilson | H03L 7/087 327/157 |
| 6,014,007 A | 1/2000 | Seibel et al. | |
| 6,704,382 B1 * | 3/2004 | Metzler | H03L 7/091 327/49 |
| 7,184,902 B2 | 2/2007 | El-Ibiary | |
| 8,169,172 B2 | 5/2012 | Markunas et al. | |
| 8,207,701 B2 * | 6/2012 | Tang | G01D 21/00 318/808 |
| 2007/0005194 A1 * | 1/2007 | Chang | G01R 19/2513 700/292 |
| 2009/0244937 A1 * | 10/2009 | Liu | H02M 1/4216 363/46 |
| 2011/0074474 A1 * | 3/2011 | Yuan | H03L 7/085 327/156 |
| 2012/0140537 A1 * | 6/2012 | Fattal | H02M 1/4216 363/126 |
| 2014/0152212 A1 | 6/2014 | Zhang et al. | |
| 2015/0309096 A1 * | 10/2015 | Choi | G01R 21/133 702/60 |
| 2016/0218652 A1 * | 7/2016 | Yamaguchi | G05B 13/02 |
| 2016/0261218 A1 * | 9/2016 | Tsukakoshi | H02P 27/04 |
| 2018/0069494 A1 * | 3/2018 | Schneider | H02P 6/17 |

FOREIGN PATENT DOCUMENTS

| | | |
|---|---|---|
| CN | 102135460 | 7/2011 |
| CN | 103078633 | 5/2013 |
| CN | 103777076 | 5/2014 |
| CN | 103825605 | 5/2014 |
| CN | 104819794 | 8/2015 |
| CN | 105915098 | 8/2016 |
| CN | 106655276 | 5/2017 |
| CN | 106849941 | 6/2017 |
| TW | I384726 | 2/2013 |
| TW | I424665 | 1/2014 |
| TW | I475238 | 3/2015 |
| TW | M498315 | 4/2015 |

OTHER PUBLICATIONS

Ben Hamed, et al. "Digital Phase Locked Loop Induction Motor Speed Controller: Design and Experiments", Leonardo Electronic Journal of Practices and Technologies, 201201, 159-174.

Grantham, et al. "Novel Method of Efficiency Measurement of AC and DC Motors", Power Electronic Drives and Energy Systems for Industrial Growth, 1998. Proceedings. 1998 International Conference on, 199812 374-379.

Mzungu, et al. "Comparison of Standards for Determining Losses and Efficiency of Three-Phase Induction Motors", IEEE PES Power Africa 2007 Conference and Exposition, 200707, 512-517.

Mouna, et al. "A Digital Phase Locked Loop Speed Control of Three Phase Induction Motor Drive: Performances Analysis", Energy and Power Engineering 201103, 61-68.

Lu, et al. "A Survey of Efficiency Estimation Methods of In-Service Induction Motors with Considerations of Condition onitoring Requirements", School of Electrical and Computer Engineering, 2005 IEEE, 1365-1372.

* cited by examiner

MEASURING APPARATUS INCLUDING PHASE LOCKED LOOP AND MEASURING METHOD THEREOF

CROSS-REFERENCE TO RELATED APPLICATION

The present disclosure is based on, and claims priority from, Taiwan Application Number 106142545, filed Dec. 5, 2017, the disclosure of which is hereby incorporated by reference herein in its entirety.

BACKGROUND

1. Technical Field

The present disclosure relates to measuring processes, and, more particularly, to a low-cost, fast, and accurate measuring system including phase-locked loops and a measuring method thereof.

2. Description of Related Art

Motors are a key component for energy transmission and transfer in products in the fields of industrial application and manufacturing. Their operational efficiency plays a major role in energy conservation and carbon reduction. Therefore, accurate handling of the energy efficiency of motors will improve energy conservation and carbon reduction efficacy.

Furthermore, the energy efficiency of a three-phase AC motor is equivalent to the ratio of the motor output power to the three-phase input power. Therefore, the measurement of the three-phase input power is one of the items that calculates the energy efficiency of the motor.

Current AC power measurement methods include three-voltmeter measurement, three-ammeter measurement, wattmeter measurement, voltage and current zero-crossing time-difference measurement, etc., of which the most common is the wattmeter measurement, in which the three-phase AC motor input power is measured by connecting two single-phase wattmeters and summing the power values displayed by the two wattmeters, or by connecting to a three-phase wattmeter. Alternatively, a three-phase power analyzer can be provided for measuring the three-phase input power.

However, these conventional measurement operations adopt indirect estimation to obtain the parameters of the motor in order to calculate the input electric power. Alternatively, in order to obtain the absorbed power of the motor at operating points of different frequencies and voltages, an expensive variable-frequency and variable-voltage three-phase AC power supply is needed, so the conventional measuring methods tend to be very high in cost, complex and time-consuming, making them difficult to be widely applied.

Therefore, there is a need for an automated, direct, fast, simple and accurate measuring mechanism that addresses the aforementioned issues in the prior art.

SUMMARY

The present disclosure discloses a phase-locked loop (PLL), which may include: a phase detector including a coordinate transformation module and a phase sequence transformation module; a filter for receiving a signal transmitted by the phase detector; and a control oscillator for receiving a signal transmitted by the filter.

The present disclosure further discloses a measuring system, which may include: a sensing circuit; the aforementioned PLL for receiving signals transmitted by the sensing circuit; and a computing device for receiving signals transmitted by the PLL.

In an embodiment, the coordinate transformation module is a Clarke coordinate transformation module.

In an embodiment, the phase sequence transformation module transforms information based on Park's Transformation.

In an embodiment, an auto-tuning module is further included in communication with the filter. In another embodiment, the auto-tuning module includes a cost function calculation module and a signal proportional-integral-derivative (PID) calculation module in communication with each other to adaptively adjust parameters of the filter.

The present disclosure further provides a measuring method, which may include providing the aforementioned PLL; sensing at least one electrical equipment by the sensing circuit and obtaining amplitudes and arguments of a phase voltage and a phase current of the electrical equipment by the PLL; and calculating the electric power of the electrical equipment by computation of a microprocessor.

In an embodiment, the PLL obtains the amplitudes and their effective values of the phase voltage and the phase current through Park's Transformation used by the phase detector, and further obtains a power factor angle of the phase voltage and the phase current to calculate the electric power of the electrical equipment.

In an embodiment, the phase voltage may be obtained by converting from a line voltage of the electrical equipment. In another embodiment, a line voltage vector of the electrical equipment has three-phase line voltage components, which may be converted into voltage components in two orthogonal axes by the coordinate transformation module, and the voltages components in the two orthogonal axes representing the three-phase line voltage components of the electrical equipment may be further converted into voltage components in a synchronous rotating coordinate system through Park's Transformation in order to obtain the argument of the line voltage vector when the line voltage vector is phase locked.

Alternatively, the PLL may further use the filter to process the signal of the phase detector, and use a control oscillator to process a signal of the filter to obtain the amplitudes and their effective values of the phase voltage and the phase current. Moreover, the PLL may further use an auto-tuning module to adaptively adjust parameters of the filter. For example, the auto-tuning module may include a cost function calculation module and a signal proportional-integral-derivative (PID) calculation module in communication with each other to adaptively adjust parameters of the filter.

As can be appreciated from the above, the measuring system and method according to the present disclosure acquire the amplitudes and the arguments of the phase voltage and the phase current of the electrical equipment (motor) through the design of the PLL, eliminating the need to measure parameters of the motor. Therefore, compared to the prior art, the present disclosure is able to provide faster measuring speeds and high accuracy. It can thus be used to replace the expensive measuring means of the prior art.

DETAILED DESCRIPTION

The present disclosure is described by the following specific embodiments. One of ordinary skill in the art can readily understand other advantages and functions of the present disclosure upon reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 1:
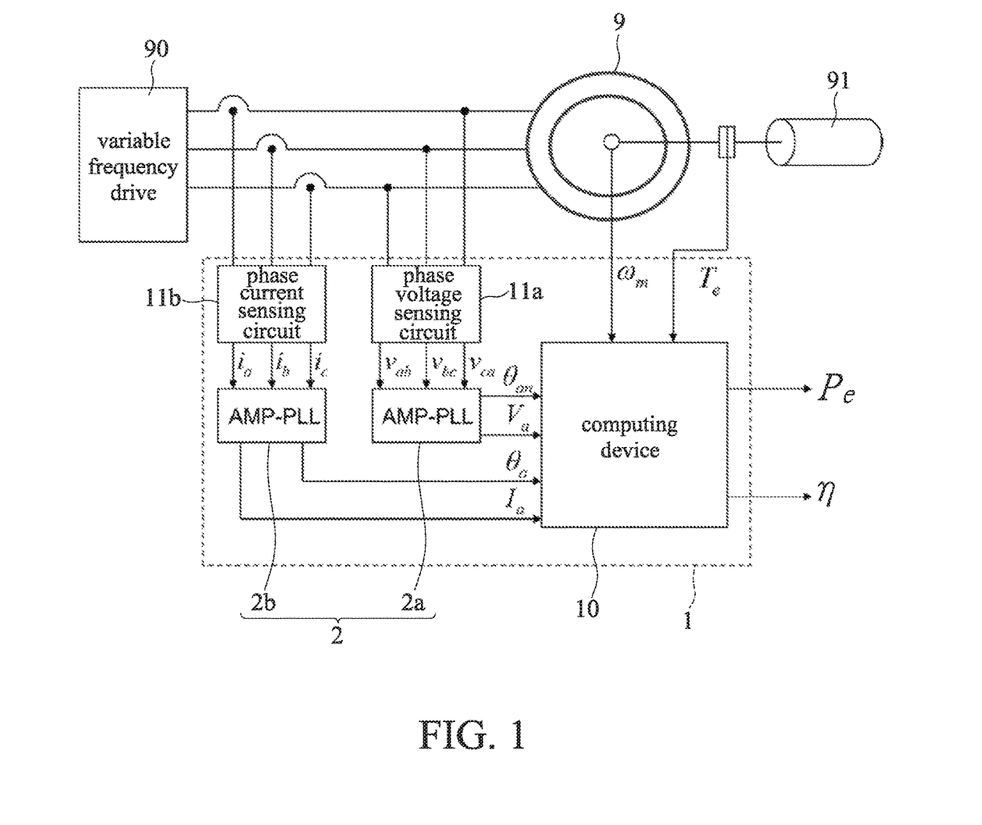
FIG. 1 is a schematic diagram depicting an application configuration of a measuring system in accordance with an embodiment of the present disclosure.

FIG. 1 is a schematic diagram depicting a measuring system 1 applied to an electrical equipment (e.g., an AC motor 9) in accordance with an embodiment of the present disclosure. In an embodiment, the AC motor 9 is a three-phase AC motor, which is controlled by a variable frequency drive 90 to output a load 91.

The measuring system 1 is provided between the AC motor 9 and the variable frequency drive 90 for measuring the power, which includes a computing device 10, such as a microprocessor (DSP28335 model), sensing circuits 11a and 11b, and adaptable motor power phase-locked loops (AMP-PLLs) 2 (simply referred to as PLLs 2 hereinafter), such that the amplitudes (having effective values $V_a$, $I_a$) and arguments ($\theta_{an}$, $\theta_a$) of the phase voltage and the phase current can be obtained by using the sensing circuits 11a and 11b and the PLLs 2, respectively, and then the power of the AC motor 9 can be calculated through calculations performed by the computing device 10.

In an embodiment, the input power of the AC motor 9 is calculated according to equation (1) below:

$$P_e = 3 V_a I_a \cos \phi \quad (1),$$

wherein $P_e$ is the three-phase power of the AC motor 9, $V_a$ and $I_a$ are effective values of the phase voltage and the phase current inputted to the AC motor 9, respectively, and $\phi$ is the argument difference (or phase difference) between the phase voltage and the phase current, which is also termed a "power factor angle."

The PLLs 2 obtain the amplitudes and their effective values $V_a$ and $I_a$ of the phase voltage and the phase current using Park's Transformation, and also obtain the power factor angle $\phi$ of the phase voltage/phase current. The variables in equation (1) are then replaced by these obtained values to calculate the input power of the AC motor 9.

In an embodiment, the PLLs including Park's transformation 2 include a voltage PLL 2a and a current PLL 2b, wherein the AC motor 9 has a "star" configuration (or a "Y" configuration), thus its phase current equals to its line current, and there is no neutral wire coming from the neutral point. Therefore, it is not easy to obtain a phase voltage of the AC motor 9, so a line voltage of the AC motor 9 is used to obtain the phase voltage. For example, the argument of a line voltage is first locked by the voltage PLL 2a and then subtracted by 30 degrees, to obtain the argument of a phase voltage.

Figure 2A:
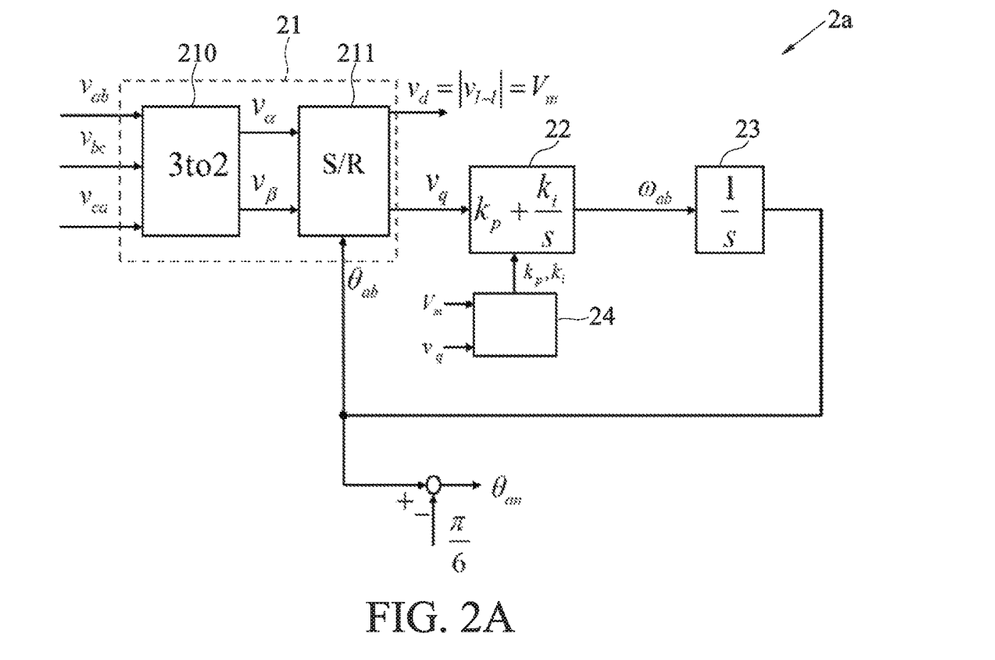
FIG. 2A is a schematic diagram depicting a circuit configuration of a voltage phase-locked loop (PLL) of the measuring system in accordance with an embodiment of the present disclosure.

In an embodiment, a circuit arrangement of the voltage PLL 2a shown in FIG. 2A includes a phase detector 21, a filter (a low pass filter or a loop filter) 22, and a control oscillator (e.g., a voltage-controlled oscillator or simply called VCO) 23. The phase detector 21 includes a Clarke coordinate transformation module 210 and a phase sequence transformation (S/R) module 211, wherein the input signals of the phase detector 21 (line voltages $v_{ab}$, $v_{bc}$, $v_{ca}$) are the three-phase components of the line voltage vector of the AC motor 9 and are shown in equation (2) below:

$$v_{ab} = V_m \cos(\omega t + \delta) = V_m \cos \theta_{ab} \quad (2)$$
$$v_{bc} = V_m \cos\left(\omega t + \delta - \frac{2\pi}{3}\right) = V_m \cos\left(\theta_{ab} - \frac{2\pi}{3}\right)$$
$$v_{ca} = V_m \cos\left(\omega t + \delta + \frac{2\pi}{3}\right) = V_m \cos\left(\theta_{ab} + \frac{2\pi}{3}\right),$$

wherein $V_m$ is the line voltage amplitude, $\omega$ is the angular frequency, t is the time, $\delta$ is the phase angle, and $\theta_{ab}$ (i.e., $\omega t + \delta$) is the argument of the line voltage $v_{ab}$ ($\omega$ equals $\omega_{ab}$).

Next, the 3-to-2 Clarke coordinate transformation module 210 is used to transform the three-phase line voltages into voltages $v_\alpha$ and $v_\beta$ of two orthogonal axes a and 13 as shown in equation (3) below.

$$\begin{bmatrix} v_\alpha \\ v_\beta \end{bmatrix} = \begin{bmatrix} 1 & 0 & 0 \\ 0 & \frac{1}{\sqrt{3}} & \frac{-1}{\sqrt{3}} \end{bmatrix} \begin{bmatrix} v_{ab} \\ v_{bc} \\ v_{ca} \end{bmatrix} \quad (3)$$

Thereafter, using the relationship shown in FIG. 3 (i.e., the relationship between the line voltage vector $v_{l-l}$ in the $\alpha$-$\beta$ coordinate system and in the d-q coordinate system), and according to Park's Transformation, the relationship between the input and output voltages of the phase sequence transformation (S/R) module 211 of the stationary to synchronous rotating coordinate transformation (or Park's Transformation) can be obtained from equation (4) below:

$$\begin{bmatrix} v_d \\ v_q \end{bmatrix} = \begin{bmatrix} \cos\theta_e & \sin\theta_e \\ -\sin\theta_e & \cos\theta_e \end{bmatrix} \begin{bmatrix} v_\alpha \\ v_\beta \end{bmatrix} \quad (4)$$

As a result, the three-phase line voltages expressed as the voltages $v_\alpha$ and $v_\beta$ in the two orthogonal axes of the stationary coordinates are transformed into voltages $v_d$ and $v_q$ in the synchronous rotating d-q coordinates, wherein $\theta_{ab}=\theta$. In order to lock the argument $\theta_{ab}$ of the line voltage $v_{ab}$, it assumes $\theta_e=\theta_{ab}$. And from FIG. 3, the following equations (5) and (6) can be obtained:

$$v_\alpha = v_{ab} = V_m \cos\theta_{ab} \quad (5)$$

$$v_\beta = V_m \sin\theta_{ab} \quad (6)$$

Equations (5) and (6) are substituted into equation (4) to obtain equations (7) and (8), respectively, as follows:

$$v_d = V_m \cos\theta_{ab} \cos\theta_e + V_m \sin\theta_{ab} \sin\theta_e = V_m \cos(\theta_{ab} - \theta_e) \quad (7)$$

$$v_q = -V_m \cos\theta_{ab} \sin\theta_e + V_m \sin\theta_{ab} \cos\theta_e = V_m \sin(\theta_{ab} - \theta_e) \quad (8)$$

Thus, from equations (7) and (8), it can be seen that when the line voltage vector $v_{l-l}$ is locked to the d axis for phase locking (i.e., $\theta_e \approx \theta_{ab}$), the voltage $v_d$ at d axis becomes $V_m$, and equation (8) can be rewritten as equation (9) below:

$$v_q = V_m(\theta_{ab} - \theta_e) \quad (9),$$

In other words, $v_q=0$. Therefore, the argument (or phase angle) $\theta_{ab}$ of the line voltage vector $v_{l-l}$ can now be found, which is the angle of the stationary-to-synchronous rotating coordinate transformation (the phase sequence transformation (S/R) 211).

As can be seen from equation (9), the phase sequence transformation (S/R) 211 of the phase detector 21 acts like a phase subtractor (or a phase comparator), so its equivalent PLL circuit configuration is as shown in FIG. 2A, similar to a phase-tracking negative-feedback automatic control, wherein the phase-tracking transfer function of the control operation is as shown in equation (10) below:

$$G_{cl}(s) = \frac{\Theta(s)}{\Theta_e(s)} = \frac{\left(k_p + \frac{k_i}{s}\right)\frac{V_m}{s}}{1 + \left(k_p + \frac{k_i}{s}\right)\frac{V_m}{s}} = \frac{V_m(k_p s + k_i)}{s^2 + V_m k_p s + V_m k_i}, \quad (10)$$

wherein $V_m$ is the line voltage amplitude, $k_p$ and $k_i$ are a proportional gain parameter and an integral gain parameter of the filter 22, respectively, and s is a constant. In terms of the steady-state response, through the final value theorem (FVT), it is known that the steady-state error of the unit-step response is zero, that is, as shown in equation (11) below:

$$\Delta\theta(t)|_{t=\infty} = \theta(t) - \theta_e(t)|_{t=\infty} = 0 \quad (11)$$

In terms of a transient response, equation (10) may correspond to a second-order system shown by equation (12) below:

$$G_{cl}(s) = \frac{\Theta(s)}{\Theta_e(s)} = \frac{V_m(k_p s + k_i)}{s^2 + V_m k_p s + V_m k_i} = \frac{2\zeta\omega_n s + \omega_n^2}{s^2 + 2\zeta\omega_n s + \omega_n^2}, \quad (12)$$

wherein $\zeta$ is called the damping ratio, $\omega_n$ is called the natural undamped frequency, thus the following equations (13) and (14) can be obtained:

$$V_m k_p = 2\zeta\omega_n \quad (13)$$

$$V_m k_i = \omega_n^2 \quad (14),$$

Since the line voltage amplitude $V_m$ varies with the magnitude of the AC power of the AC motor 9, so does its transient response. If $k_p$ and $k_i$ are set as to be constants, then it is possible that, due to a small $V_m$, the corresponding $\zeta$ and $\omega_n$ are too small for phase locking.

In view of this, adaptive control is employed to adaptively adjust the parameters $k_p$ and $k_i$ of the filter 22, for example, as can be achieved by an auto-tuning module 24 shown in FIG. 2A. The auto-tuning module 24 includes a cost function calculation module 240, a proportional-integral-derivative (PID) calculation module 241, and an adaptive calculation module 242. More specifically, the numerical values of the damping ratio $\zeta$ and the natural undamped frequency $\omega_n$ are set (e.g., $\zeta$ can be 0-0.999 and $\omega_n$ can be N×2π, where Nl is a positive integer). In an embodiment, $\zeta=0.707$, $\omega=30\times2\pi$, N=188.4. These values are substituted into equations (13) and (14) with the addition of higher-order compensation terms $dk_p$ and $dk_i$ to obtain equations (15) and (16) below:

$$k_p = \frac{2\zeta\omega_n}{V_m} + dk_p = \frac{2 \times 0.707 \times 188.4}{V_m} + dk_p \quad (15)$$

$$k_i = \frac{\omega_n^2}{V_m} + dk_i = \frac{188.4 \times 188.4}{V_m} + dk_i. \quad (16)$$

Figure 4:
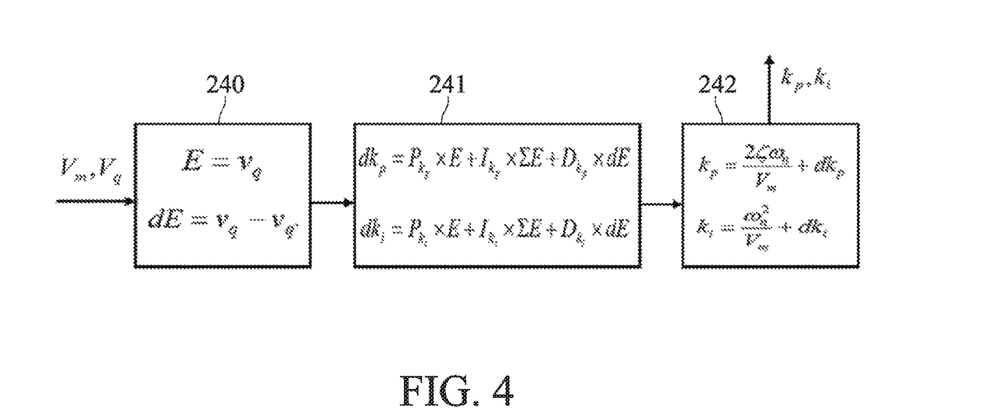
FIG. 4 is a schematic diagram depicting a circuit configuration of an auto-tuning module in a PLL in accordance with an embodiment of the present disclosure.
Figure 5A:
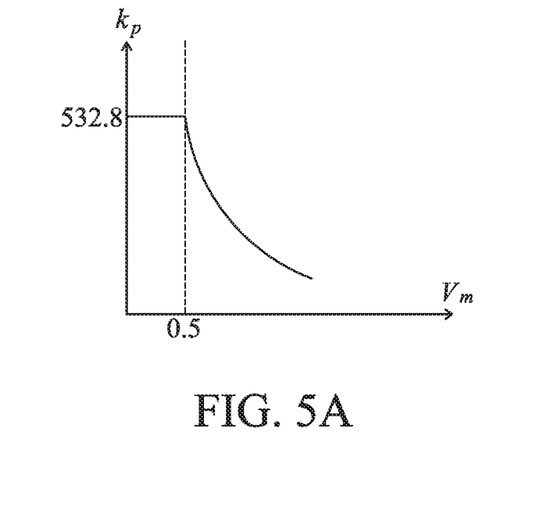
FIGS. 5A and 5B are graphs depicting parameter adjustments of a loop filter in a PLL in accordance with an embodiment of the present disclosure.
Figure 5B:
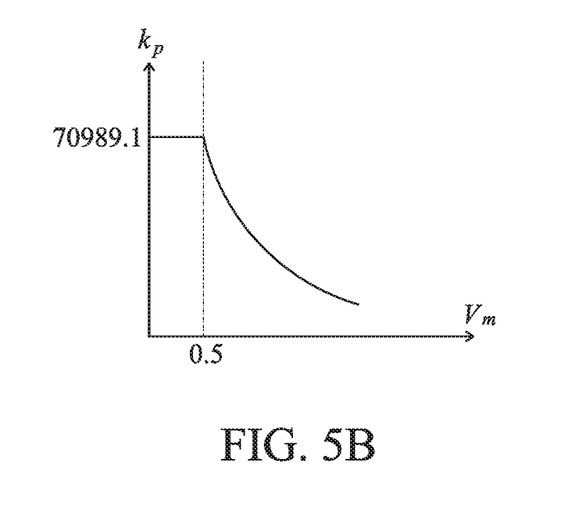

In addition, when $V_m>0$, phase locking can be performed. In an embodiment, in order to avoid the unfavorable situations for phase locking where $V_m$ approaches zero, $k_p$ and $k_i$ can be set to be constants when $V_m$ is a specific value (e.g., $V_m=0.2$-$0.7$) (for example, $V_m=0.5$, $k_p=532.8$, $k_i=70989.1$ as shown in FIGS. 5A and 5B). And then the phase locking can be automatically and quickly performed when $V_m$ exceeds the specific value (the varying curves of $k_p$ and $k_i$ with respect to $V_m$ as shown in FIGS. 5A and 5B), and $dk_p$ and $dk_i$ are higher-order compensation terms. For example, the numerical values of $k_p$ and $k_i$ can be calculated by the cost function calculation module 240 and the PID calculation module 241 in the auto-tuning module 24 of FIG. 4 (from the declining curves of $k_p$ and $k_i$ with respect to $V_m$ shown in FIGS. 5A and 5B, it can be understood that when $V_m$ approaches infinity, the rates of declining get smaller and smaller and the curves level off), wherein E of the cost function calculation module 240 equals to the numerical value of the voltage $v_q$ on the q axis, and dE is an optimized performance (which indicates the amount of change of $v_q$, i.e., $v_q-v_{q'}$). In the PID calculation module 241, $P_{Kp}$ is a proportional constant of $k_p$, $I_{Kp}$ is an integral constant of $k_p$, $D_{Kp}$ is a derivative constant of $k_p$, $P_{Ki}$ is a proportional constant of $k_i$, $I_{Ki}$ is an integral constant of $k_i$, $D_{Ki}$ is a derivative constant of $k_i$, and $\Sigma E$ is an integral accumulative error. More specifically, the mathematical formula for the PID calculation module 241 are given in equations (16-2) and (16-3) below, proportional units (P), integral units (I) and derivative units (D) are represented in each equations:

$$dk_p = P_{k_p} \times E + I_{k_p} \times \Sigma E + D_{k_p} \times dE \quad (16\text{-}2)$$

$$dk_i = P_{k_i} \times E + I_{k_i} \times \Sigma E + D_{k_i} \times dE \quad (16\text{-}3).$$

Thus, the purpose of the cost function calculation module 240 is to evaluate reference indicators, which are defined as the value of $v_q$ and the amount of change of $v_q$. The purpose of the PID calculation module 241 is to automatically correct errors, in which the higher-order compensation terms $dk_p$ and $dk_i$ are calculated based on the value of $v_q$ and the amount of change of $v_q$. The purpose of the adaptive calculation module 242 is to calculate the parameters $k_p$ and $k_i$, wherein it receives the higher-order compensation terms $dk_p$ and $dk_i$, and adaptively adjusts the parameters $k_p$ and $k_i$ with respect to the line voltage amplitude $V_m$.

It can be appreciated that there are various ways for implementing the calculations done by the PID calculation module 241. In FIG. 4, a relative simple method is used for the PID calculation module 241 to achieve the desired objective, but the present disclosure is not limited to that illustrated with respect to FIG. 4.

Figure 6A:
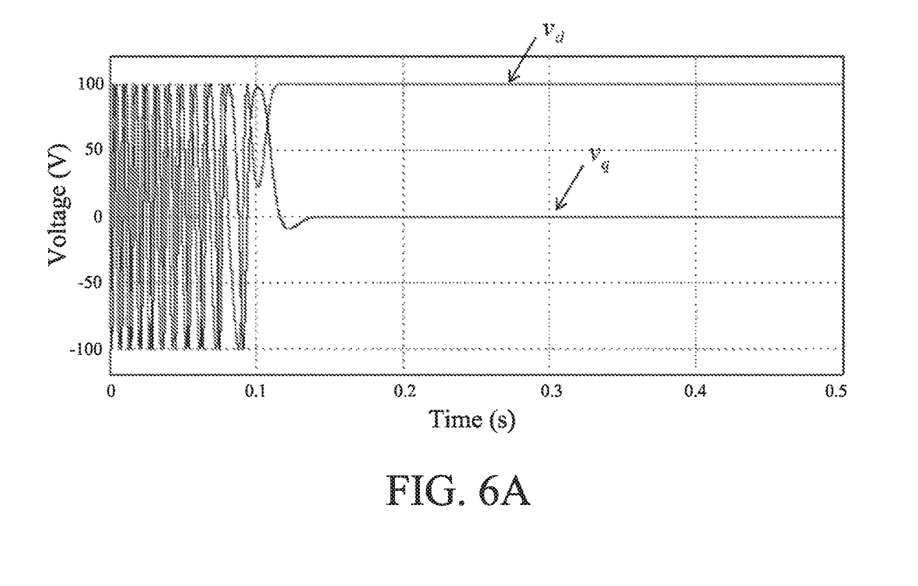
FIGS. 6A and 6B are graphs showing simulations of the PLL in accordance with an embodiment of the present disclosure at different line voltages.
Figure 6B:
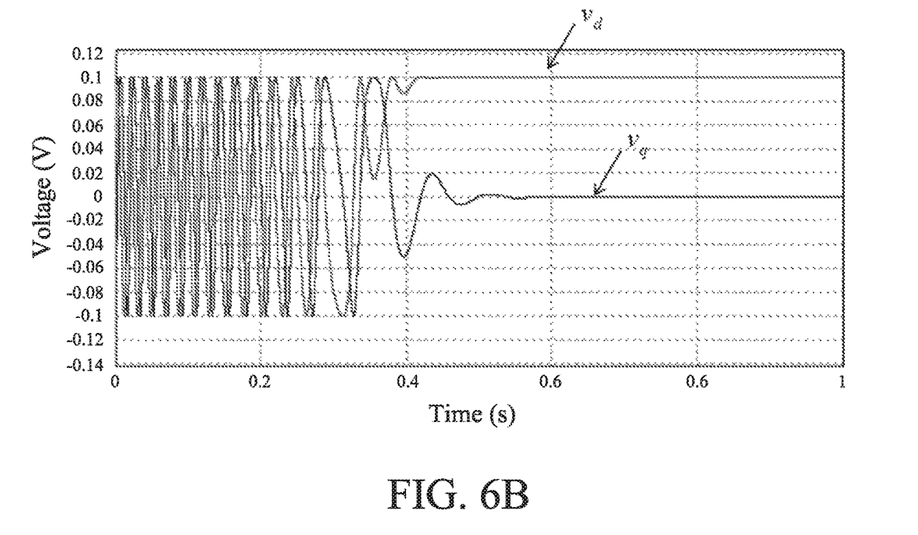

Specifically, during an experiment simulating the voltage PLL 2a, different line voltages are given (e.g., 100V and 0.1V), the results of the simulations are shown in FIGS. 6A and 6B. It can be seen that the voltages $v_d$ on the d axes converge to 100V and 0.1V, respectively, and the voltages on the q axes both converge to 0, thereby achieving convergence and phase locking.

As a result, with reference to FIG. 2A, through the design of the auto-tuning module 24, when the line voltage amplitude $V_m$ is given, the values of $k_p$ and $k_i$ can then be set. This allows $\omega_{ab}$ to be directly inputted into the control oscillator 23 without having to input other adjusting frequencies into the control oscillator 23, thereby stabilizing the operations of the voltage PLL 2a while achieving phase tracking and locking.

Furthermore, when $\theta_e = \theta_{ab}$, voltage $v_q = 0$, which is equivalent to the line voltage vector $v_{l-l}$ being locked on the d axis. Also, since the argument $\theta_{an}$ of the phase voltage $v_{an}$ is roughly 30 degrees less than the argument $\theta_{ab}$ of the line voltage $v_{ab}$, after obtaining $\theta_{ab}$, the argument $\theta_{an}$ of the phase voltage $v_{an}$ can then be obtained from equation (17) below:

$$\theta_{an} = \theta_{ab} - \frac{\pi}{6}. \quad (17)$$

Figure 3:
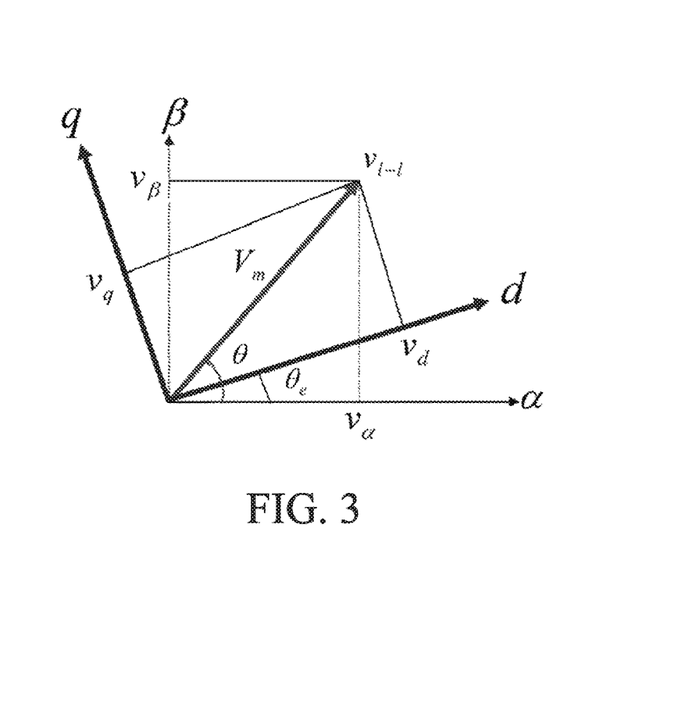
FIG. 3 is a graph illustrating the relationship of a line voltage vector of a phase detector in a PLL in α-β coordinates and in d-q coordinates in accordance with an embodiment of the present disclosure.

From FIG. 3, it can be seen that the magnitude of the line voltage vector $v_{l-l}$ is the line voltage amplitude $V_m$. And based on the basic theory of electrodynamics, the effective value $V_a$ of the amplitude of the phase voltage $v_{an}$ of the AC motor 9 can be obtained as indicated in equation (18) below:

$$V_a = \frac{V_m}{\sqrt{6}}. \quad (18)$$

Figure 2B:
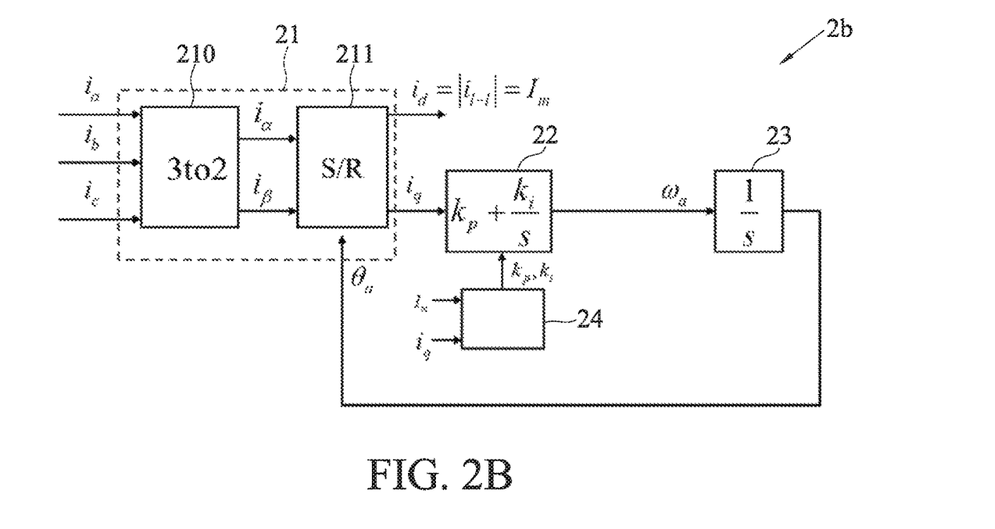
FIG. 2B is a schematic diagram depicting a circuit configuration of a current PLL of the measuring system in accordance with an embodiment of the present disclosure.

Similarly, according to the same circuit configuration of FIG. 2A, the configuration of the current PLL 2b can be provided, wherein the AC motor 9 employs a "star" configuration (or a "Y" configuration), thus its phase current equals to its line current. More specifically, the configuration of the current PLL 2b is shown in FIG. 2B, which locks onto the argument $\theta_a$ of the phase current of a line A and the magnitude of the phase current vector (i.e., the phase current amplitude $I_m$), and the control oscillator 23 is a current controlled oscillator. Based on the basic theory of electrodynamics, the effective amplitude value $I_a$ of the phase current of the AC motor 9 is as shown in equation (19) below:

$$I_a = \frac{I_m}{\sqrt{2}}. \quad (19)$$

Moreover, the auto-tuning module 24 of the current PLL 2b shown in FIG. 2B performs adaptive control operations, such that the proportional gain parameter $k_p$ and the integral gain parameter $k_i$ of the filter 22 can be adaptively adjusted, wherein the auto-tuning module 24 includes the cost function calculation module 240, the PID calculation module 241, and the adaptive calculation module 242.

More specifically, the values of the damping ratio $\zeta$ and the natural undamped frequency $\omega_n$ are set and substituted into equations (13) and (14) (replacing $V_m$ with $I_m$) with the addition of the higher-order compensation terms $dk_p$ and $dk_i$ to obtain equations (15) and (16) (replacing $V_m$ with $I_m$). When $I_m > 0$, phase locking can be performed. And in order to avoid the unfavorable situations for phase locking where $I_m$ approaches zero, $k_p$ and $k_i$ can be set to be constants when $I_m$ is a specific value. And phase locking can be automatically and quickly performed when $I_m$ exceeds the specific value (the varying curves of $k_p$ and $k_i$ with respect to $V_m$ as shown in FIGS. 5A and 5B), and $dk_p$ and $dk_i$ are higher-order compensation terms. The numerical values of $k_p$ and $k_i$ can be calculated, for example, by the cost function calculation module 240 (replacing $v_q$ and $v_q'$ with $i_q$ and $i_q'$, E being equal to the numerical value of the current $i_q$ on the q axis, and dE being an optimized performance (which herein indicates the amount of change of $i_q$, i.e., $i_q - i_q'$)), the PID calculation module 241 (replacing $V_m$ with $I_m$) and the adaptive calculation module 242 in the auto-tuning module 24 shown in FIG. 4. The mathematical equation of the PID calculation module 241 is as shown in equations (16-2) and (16-3). Thus, the purpose of the cost function calculation module 240 is to evaluate reference indicators, which are herein defined as the value of $i_q$ and the amount of change of $i_q$; the purpose of the PID calculation module 241 is to automatically correct errors, herein meaning calculating the higher-order compensation terms $dk_p$ and $dk_i$ based on the value of $i_q$ and the amount of change of $i_q$; and the purpose of the adaptive calculation module 242 is to calculate the parameters $k_p$ and $k_i$.

For example, during an experiment simulating the current PLL 2b, different default line currents are given, the results of the simulations similarly indicate the currents id on the d axis converge to their respective default current values, while the currents on the q axis all converge to 0, thereby achieving convergence and phase locking.

As a result, with reference to the current PLL 2b of FIG. 2B, through the design of the auto-tuning module 24, when the line current amplitude $I_m$ is given, the proportional gain parameter and the integral gain parameter $k_p$ and $k_i$ can then be set. This allows $\omega_a$ to be directly inputted into the control oscillator 23 without having to input other adjusting frequencies into the control oscillator 23, thereby stabilizing the operations of the current PLL 2b while achieving phase tracking and locking.

Moreover, the phase difference (power factor angle) $\phi$ between the argument $\theta_{an}$ of the phase voltage and the argument $\theta_a$ of the phase current is as shown in equation (20) below:

$$\phi = \theta_{an} - \theta_a. \tag{20}$$

Therefore, equations (18) to (20) are substituted into equation (1) to calculate the three-phase input power $P_e$ of the AC motor 9 as indicated by the formula below:

$$P_e = 3 \times \frac{V_m}{\sqrt{6}} \times \frac{I_m}{\sqrt{2}} \times \cos(\theta_{an} - \theta_a).$$

Furthermore, if the rotational speed $\omega_m$ and the torque $T_e$ of the AC motor 9 are known, then the mechanical power $P_m$ outputted by the AC motor 9 can be determined, and the efficiency $\eta$ of the AC motor 9 can be calculated with the following equation (21):

$$\eta = \frac{P_m}{P_e} = \frac{T_e \omega_m}{3 V_a I_a \cos\phi}. \tag{21}$$

Therefore, the PLLs 2 employed by the measuring system 1 and the measuring method of the present disclosure have the following technical features:

(1) Compared to the situation in which the argument (phase) $\theta_e$ of a feedback signal $u_2(t)$ of a conventional PLL (being a sine or cosine signal (i.e., $u_2(t)=V_m \cos \theta_e$)) and the line voltage amplitude $V_m$ cannot be obtained directly after phase locking, the feedback signal of the PLL 2 of the present disclosure is the argument (phase) $\theta_e$ (equals to $\theta_{ab}$). And after obtaining the arguments (phases) of the phase voltage and the phase current $\theta_e$ (equals to $\theta_{ab}$), the phase difference (power factor angle) $\phi$ between the phase voltage and the phase current can be determined from equation (20) to obtain the line voltage amplitude $V_m$ (which equals to the line voltage vector $v_{l-l}$ as shown in FIG. 3) by converting into d-q axis synchronous rotating coordinates using Park's Transformation.

(2) As there is no neutral wire coming out of the neutral point, it is difficult to obtain the phase voltage signals of the three-phase AC motor. The measuring method of the present disclosure uses the voltage PLL 2a for measuring a line voltage to obtain the line voltage amplitude $V_m$ and its argument (phase) $\theta_e$ (equals to $\theta_{ab}$). Then the argument (its effective value $V_a$) and the argument (phase) $\theta_{an}$ are obtained, i.e., equations (17) and (18).

(3) Traditionally, a loop filter of a conventional PLL employs a low-pass filter (e.g., RC type), its operation is represented by equation (22) below:

$$G(s) = \frac{b}{s+a}, \tag{22}$$

and a phase-tracking closed-loop transfer function thereof is as shown in equation (23) below:

$$G_{cl}(s) = \frac{\Theta(s)}{\Theta_e(s)} = \frac{\frac{b}{s+a}\frac{V_m}{s}}{1+\frac{b}{s+a}\frac{V_m}{s}} = \frac{bV_m}{s^2+as+bV_m}. \tag{23}$$

Conversely, the filter 22 of the present disclosure is a PI (proportional-integral) controller. Comparing equations (10) and (23), the numerator of equation (1) includes a zero point representing derivative, while the numerator of equation (23) is a constant value $bV_m$. Thus, equation (10) of the present disclosure will have a faster step response than the prior-art equation (23). Therefore, the PLL 2 of the present disclosure obtain faster phase tracking and a phase-locked response.

(4) Compared to noise being generated by the direct measuring method of prior art, the present disclosure employs the design in which the auto-tuning module 24 provided next to the filter 22 (refer to descriptions with respect to FIGS. 4, 5A and 5B) to filter out noise without incurring operational delay, thereby stabilizing the operations of the PLLs 2 while achieving phase tracking and locking. If the auto-tuning module 24 is provided at the side of the phase detector 21 to filter out noise, there is a possibility for operational delay.

(5) As an output signal of a conventional PLL is an AC signal and generated by a voltage-controlled oscillator, a central oscillator is required to generate the AC signal by adding/subtracting frequencies to/from a center frequency. However, the PLL of the present disclosure primarily obtains a phase instead of an AC signal, so a center frequency is not required to obtain the phase. Further, the PI controller in the PLL is suffice to track and lock the phase. The present disclosure measures the motor power of any arbitrary rotational speeds (frequencies), thus a central oscillator is not required.

Figure 7:
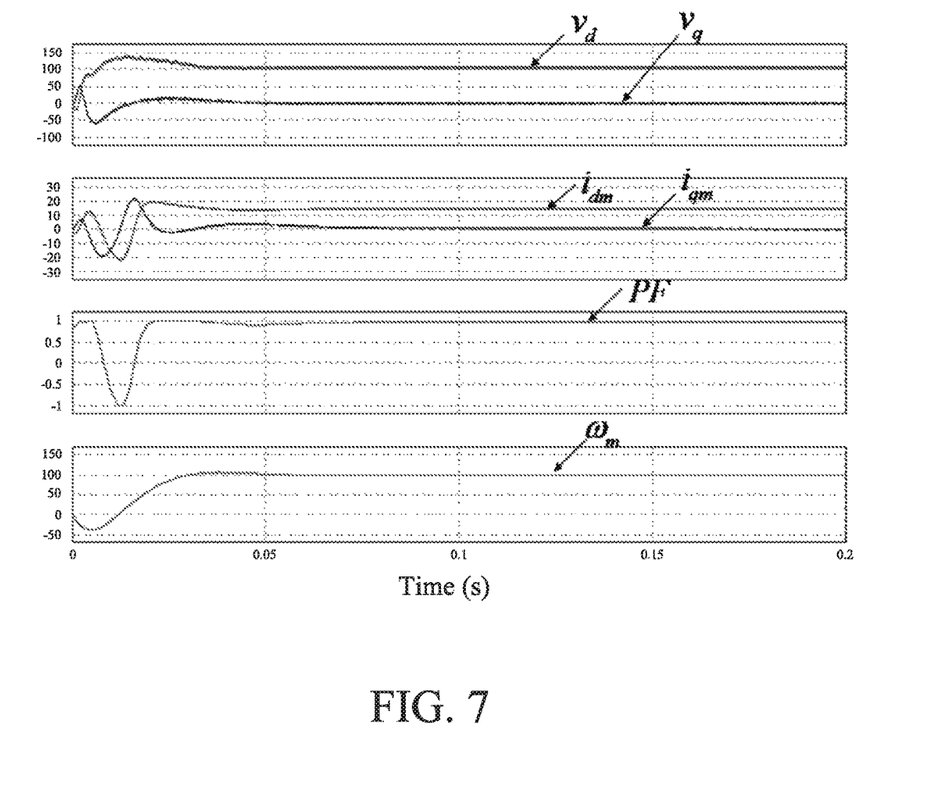
FIG. 7 is a graph showing simulations of the PLL in accordance with an embodiment of the present disclosure with respect to line voltages and phase currents.
Figure 8:
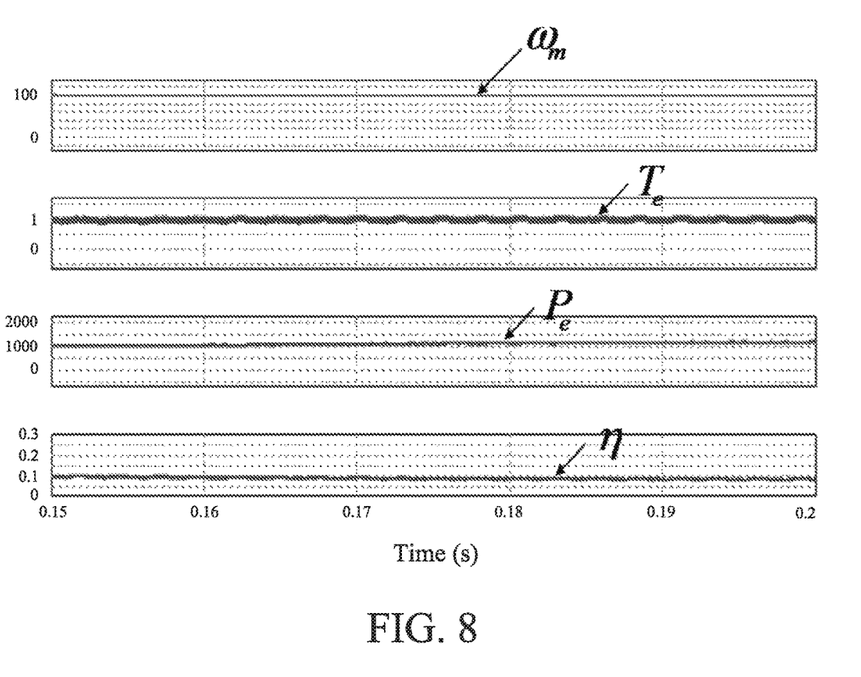
FIG. 8 is a simulated measurement results of the measuring system of FIG. 1.

In addition, the mechanical configuration shown in FIG. 1 (i.e., the configuration for measuring electric power and efficiency of the AC motor 9 (three-phase AC motor) using the PLLs 2) can be constructed by using PSIM power electronics simulation software to verify the correctness of the measuring method of the present disclosure. When the variable frequency drive 90 gives instructions specifying a rotational speed $\omega_m$ of 100 rad/s and a torque $T_L$ of 1 Nm for the load 91. It can be seen from the simulated verification results shown in FIG. 7 that the value of the steady-state response of the rotational speed $\omega_m$ is 100 rad/s. The line voltages on d-q axes after phase locking are $v_q=0$ and $v_d=102V$. The phase current after phase locking becomes $i_{qm}=0$ and the steady-state value of $i_{dm}$ is the phase current amplitude $I_m$ (about 14.3 A). The power factor is PF=cos $\psi=0.98$. When the rotational speed $\omega_m$ is in steady state, as shown in FIG. 8, the torque $T_e$ of the AC motor 9 is 1 Nm, which is the same as the torque $T_L$ of load 91. The electric power $P_e$ is approximately 1.27 kW, which equals to the value calculated using equation (1). And The efficiency $\eta$ is approximately 0.08, which equals to the value calculated using equation (21). As such, the simulated results prove the correctness of the measuring method of the present disclosure.

In conclusion, the measuring system and method according to the present disclosure only need to acquire the amplitudes, the arguments, and the argument difference (the power factor angle) of the phase voltage and the phase current in order to calculate the three-phase input electric power of the AC motor without having to measure parameters of the AC motor (no need to measure the impedance directly). Therefore, compared to the prior art, when used in measuring a variable-frequency equipment (or an inverter motor), the present disclosure is able to provide fast measuring speeds (about 10 times faster) with errors (about 0.5-1%) within the tolerance. It can thus be used to replace the conventional expensive electronic analyzers.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A phase-locked loop (PLL), comprising:
a phase detector configured for receiving an input signal and comprising a coordinate transformation module and a phase sequence transformation module;
a filter configured for receiving a transformed signal transmitted by the phase detector;
an auto-tuning module in communication with the filter; and
a control oscillator configured for receiving a parameter-adjusted signal transmitted by the filter and generating an argument of the input signal.

2. The phase-locked loop of claim 1, wherein the coordinate transformation module is a Clarke coordinate transformation module.

3. The phase-locked loop of claim 1, wherein the phase sequence transformation module transforms information based on Park's Transformation.

4. The phase-locked loop of claim 1, wherein the auto-tuning module includes a cost function calculation module and a signal proportional-integral-derivative (PID) calculation module in communication with each other to adaptively adjust parameters of the filter.

5. A measuring system, comprising:
a sensing circuit;
the PLL of claim 1 configured for receiving signals transmitted by the sensing circuit; and
a computing device configured for receiving signals transmitted by the PLL and calculating an electric power of an electrical equipment.

6. The measuring system of claim 5, wherein the coordinate transformation module is a Clarke coordinate transformation module.

7. The measuring system of claim 5, wherein the phase sequence transformation module transforms information based on Park's Transformation.

8. The measuring system of claim 5, wherein the auto-tuning module includes a cost function calculation module and a signal proportional-integral-derivative (PID) calculation module in communication with each other to adaptively adjust parameters of the filter.

9. A measuring method, comprising:
sensing at least one electrical equipment by a sensing circuit and obtaining amplitudes and arguments of a phase voltage and a phase current of an electrical equipment by a phase-locked loop (PLL);
by using a phase detector of the PLL, receiving an input signal and transforming the input signal through a coordinate transformation module and a phase sequence transformation module;
by using a filter, receiving a transformed signal transmitted from the phase detector;
by using a control oscillator, receiving a parameter-adjusted signal transmitted from the filter and generating an argument of the input signal; and
calculating an electric power of the electrical equipment by computation of a microprocessor.

10. The measuring method of claim 9, wherein the PLL obtains the amplitudes and their effective values of the phase voltage and the phase current through Park's Transformation used by the phase detector, and further obtains a power factor angle of the phase voltage and the phase current, and the microprocessor calculates the electric power of the electrical equipment.

11. The measuring method of claim 10, wherein the phase voltage is obtained by converting a line voltage of the electrical equipment.

12. The measuring method of claim 11, wherein a line voltage vector of the electrical equipment has three-phase line voltage components, which are converted into voltage components in two orthogonal axes by the coordinate transformation module, and the voltage components in the two orthogonal axes representing the three-phase line voltage components of the electrical equipment are further converted into voltage components in a synchronous rotating coordinate system through Park's Transformation in order to obtain an argument of the line voltage vector when the line voltage vector is phase locked.

13. The measuring method of claim 10, wherein the PLL further uses the filter to process a signal of the phase detector, and uses a control oscillator to process a signal of the filter to obtain the amplitudes and their effective values of the phase voltage and the phase current.

14. The measuring method of claim 13, wherein the PLL further uses an auto-tuning module to adaptively adjust parameters of the filter.

15. The measuring method of claim 14, wherein the auto-tuning module includes a cost function calculation module and a signal proportional-integral-derivative (PID) calculation module in communication with each other to adaptively adjust the parameters of the filter.

* * * * *